(12) United States Patent
Lee et al.

(10) Patent No.: US 6,333,235 B1
(45) Date of Patent: Dec. 25, 2001

(54) METHOD FOR FORMING SIGE BIPOLAR TRANSISTOR

(75) Inventors: Chwan-Ying Lee, Tainan; Tzuen-Hsi Huang, Tou Liu, both of (TW)

(73) Assignee: Industrial TechnologyResearch Institute (TW)

( * ) Notice: Subject to any disclaimer, the term of this patent is extended or adjusted under 35 U.S.C. 154(b) by 0 days.

(21) Appl. No.: 09/547,871

(22) Filed: Apr. 12, 2000

(51) Int. Cl.[7] .................... H01L 21/331; H01L 21/8222
(52) U.S. Cl. .................. 438/309; 438/341; 438/353; 438/359; 438/361
(58) Field of Search .................... 438/309, 341, 438/353, 359, 361

(56) References Cited

U.S. PATENT DOCUMENTS

| | | | |
|---|---|---|---|
| 5,008,208 | * 4/1991 | Liu et al. | 438/361 |
| 5,217,909 | * 6/1993 | Bertagnolli | 438/320 |
| 5,254,485 | * 10/1993 | Segawa et al. | 438/370 |
| 5,256,896 | * 10/1993 | Ning | 257/585 |
| 5,620,908 | * 4/1997 | Inoh et al. | 438/207 |
| 5,686,322 | * 11/1997 | Beasom | 438/322 |

\* cited by examiner

*Primary Examiner*—Matthew Smith
*Assistant Examiner*—Lex H. Malsawma

(57) ABSTRACT

A method for fabricating bipolar transistor frequently used in high frequency circuit is disclosed herein. The foregoing method includes the following steps. First, a first oxide layer is formed on a p-type substrate, followed by developing a first photoresist pattern on the first oxide layer. A first, doped region is formed in the exposed substrate by a first implanting step. The first doped region comprises a n+ buried layer. Stripping of the first photoresist pattern, and annealing of the n+ buried layer follow. Removal of the first oxide layer to expose the n+ buried layer and a portion of the p-type substrate follows thereafter. These steps are followed by growing a first epitaxial layer on the n+ buried layer and a portion of the substrate, then a second epitaxial layer is formed on the first epitaxial layer. The first epitaxial layer is made of epitaxial n-type silicon, and the second epitaxial layer is made of in situ epitaxial p-type SiGe. Next, a plurality of first and second trench isolation are formed. A gate oxide layer is formed and the extrinsic base is formed in the second epitaxial layer. A polysilicon emitter pattern is formed and is connected to the intrinsic base, followed by the fabrication of a silicide pattern connected to the n+ buried layer, whereby the collector is formed. A portion of the gate oxide layer is etched, and the underlying extrinsic base as the well as the intrinsic base acting as the base of the bipolar transistor is connected to a metal pattern.

33 Claims, 9 Drawing Sheets

Fig. 1A

<Prior art>

Fig. 1B

<Prior art>

Fig. 1C

<Prior art>

<Prior art>

Fig. 1G

<Prior art>

Fig. 1H

<Prior art>

METHOD FOR FORMING SIGE BIPOLAR TRANSISTOR

BACKGROUND OF THE INVENTION

1. Field of the Invention

The present invention relates to a method of forming a SiGe bipolar transistor, and especially relates to a method for forming a SiGe bipolar transistor utilized in a high frequency circuit with lowered thermal budget.

2. Description of the Prior Art

Because of the characteristic of the bipolar transistor, and because the signal processed by the transistor in the radio frequency circuit is a signal having high frequency, the bipolar transistor, especially the SiGe bipolar transistor, is frequently employed in the radio frequency circuit. However the traditional SiGe bipolar transistor manufacturing process has many disadvantages such as low yield resulting from the low growth rate of the epitaxial growth process. In addition, in the traditional method, the epitaxial growth process is utilized two times when fabricating the SiGe bipolar transistor. The first epitaxial growth process is used to fabricate the collector layer, which is about 1 micron in thickness, and the second epitaxial growth process is used to form the epitaxial bass layer. Because the epitaxial growth process takes a lot of time, thus the two epitaxial growth processes utilized by the traditional SiGe bipolar transistor manufacturing process take much more time, and take longer cycling time as well as producing lower yield.

In addition, before epitaxially growing the SiGe layer, it is necessary to proceed with the wafer, which is very troublesome. Also, this tends to waste manufacturing time and result in lower yield to some extent. The process sequence employed to manufacture the heterojunction bipolar transistor (HBT) is described to illustrate how a SiGe bipolar transistor is fabricated via the traditional process.

Figure 1A:
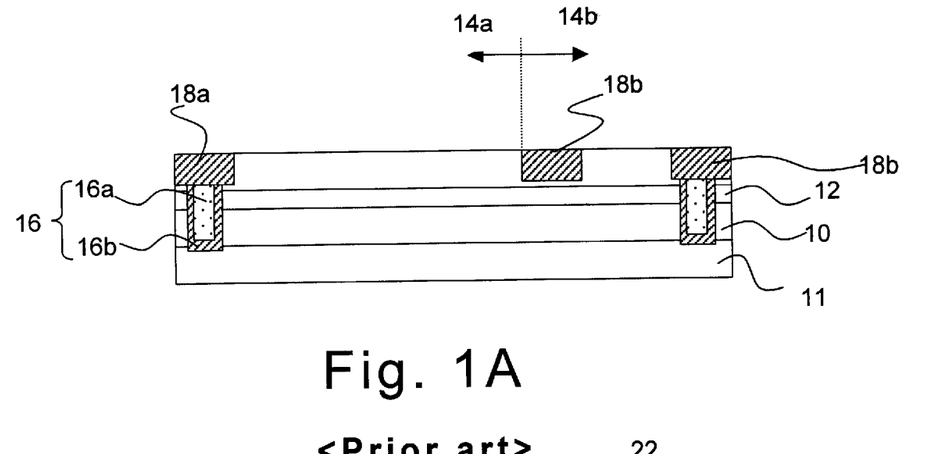
FIGS. 1A to 1H illustrate the processes utilized to fabricate the SiGe bipolar transistor using two layer of epitaxial layer according to the prior art.

As shown in FIG. 1A, the first step is to form a P type epitaxial layer 10 on a silicon substrate 11, and the next step is to form a n$^+$ buried layer 12 on the P type epitaxial layer 10 by an implanting step. Followed by the foregoing implanting step, a n$^-$ epitaxial layer 14 is formed on the n$^+$ buried layer 12 by a first expitaxial growth step, which is controlled at a temperature from about 1000 C. to 1200 C. Subsequently a first photography step and a first etching step are used to etch the n$^-$ epitaxial layer 14 and then the trench in the n$^+$ buried layer 12 and the P type epitaxial layer 10 is defined, exposing a portion of the silicon substrate 11. The concentration of the conductive carrier in the n$^-$ epitaxial layer 14 is designed to be that of the collector of the SiGe bipolar transistor. The etched n$^-$ epitaxial layer 14 includes the first area 14a having a first cave and the second area 14b having a second cave.

The first area 14a is designed to be defined as the active area of the transistor that will be fabricated in the following processes, and the second area 14b is designed to be defined as the collector of the transistor that will be fabricated in the following processes. The next step is to form the trench isolation 16, which comprised of polysilicon portion 16a and oxide portion 16b at the interior surface of the trench at the bottom of both the first cave and the second cave. The silicon dioxide is then filled into the first cave in the etched portion of the n$^-$ epitaxial layer 14, so the first silicon dioxide pattern 18a is formed in the first area 14a of the n$^-$ epitaxial layer 14. In addition, the second silicon dioxide pattern 18b is formed in the second area 14b of the n$^-$ epitaxial layer 14.

Figure 1B:
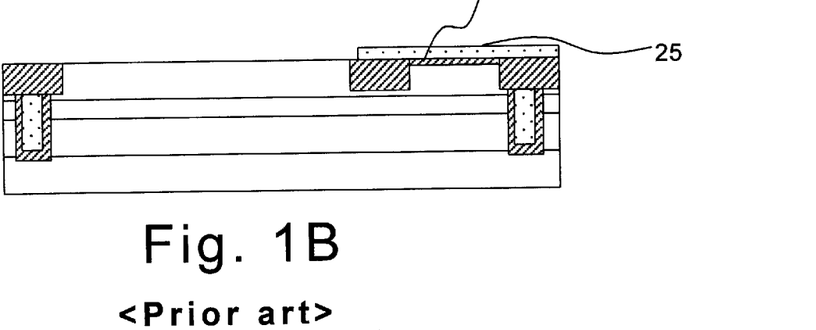

After the active area and collector of the transistor have been defined, the base of the transistor is to be defined according to the following processes. However, a layer of native oxide is always expectedly formed on the surface of the first area 14a and the second area 14b of the n$^-$ epitaxial layer 14. Due to the unavoidable formation of the native oxide layer 22 on the n$^-$ epitaxial layer 14, referring to FIG. 1B, the first polysilicon layer 25 is formed on the native oxide layer 22. The wafer having the native oxide layer 22 on the second area 14b of the n$^-$ epitaxial layer 14 is immersed into HF to remove the exposed native oxide layer. It is important that the wafer must be directly sent to the tube which growing the GeSi epitaxial layer 30 (referring to FIG. 1C) without any cleaning step using water. The transmission of the wafer which was immersed into the HF is very dangerous for the operator, and a layer of several angstroms of native oxide layer 22 on the surface of the first area 14a of the n$^-$ epitaxial layer 14 still exist after the etching process using HF. Though the residual native oxide layer 22 is not shown in FIG. 1B and FIG. 1C, it still exists between the GeSi epitaxial layer 30 and the first area 14a of the n$^-$ epitaxial layer 14. So the yield of fabricating SiGe bipolar transistor using prior art is relatively lowered, and the cycling time is increased because the GeSi epitaxial layer 30 is formed by a second epitaxial growth process controlled under about 550 degrees in the centigrade scale.

Figure 1C:
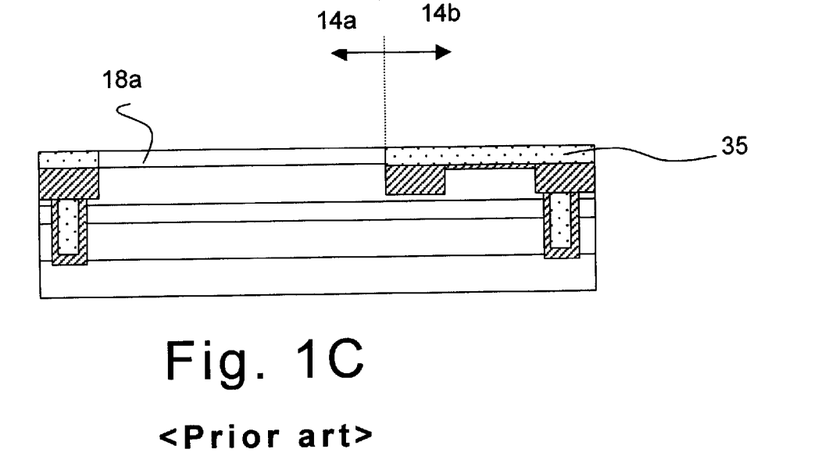

The GeSi epitaxial layer 30 mentioned above is designed as the base of the SiGe bipolar transistor that is to be fabricated in the following processes, in addition, the SiGe bipolar transistor is usually employed in the high frequency circuit. So the concentration of the carrier and the thickness of the base of the SiGe bipolar transistor must be very carefully controlled.

Figure 1D:
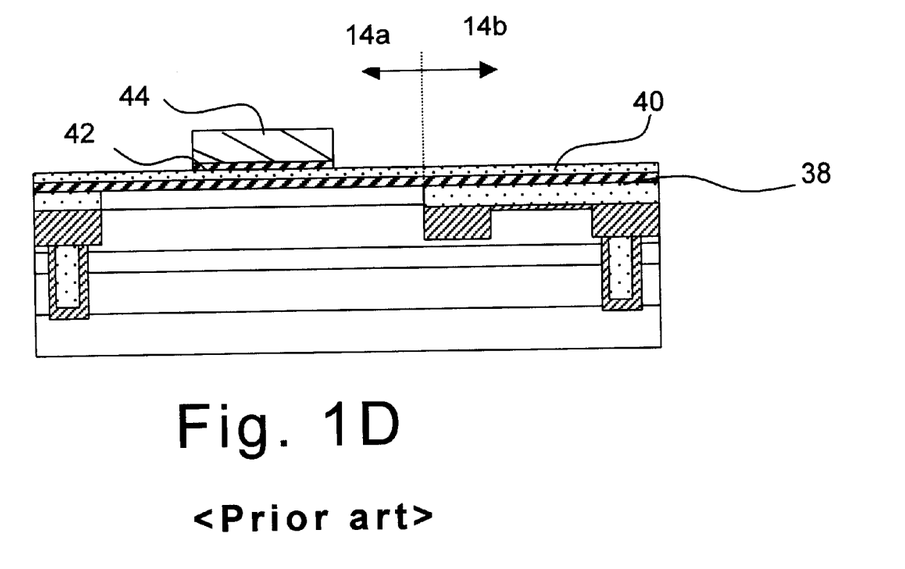

After the GeSi epitaxial layer 30 had been formed on the surface of the second area 14b of the n$^-$ epitaxial layer 14, the first polysilicon layer 25 is transferred into the polycrystalline GeSi layer 35. Next, and referring to FIG. 1D, a first silicon nitride layer 38 and a second polysilicon layer 40 are subsequently formed on the GeSi epitaxial layer 30 and the polycrystalline GeSi layer 35. In order to define the base of the transistor, a second silicon nitride layer 42 and a silicon dioxide layer 44 are subsequently formed on the second polysilicon layer 40 followed by their being patterning. So the patterned second silicon nitride layer 42 and the patterned silicon dioxide layer 44 are formed on the surface of the second polysilicon layer 40 in the first area 14a.

Figure 1E:
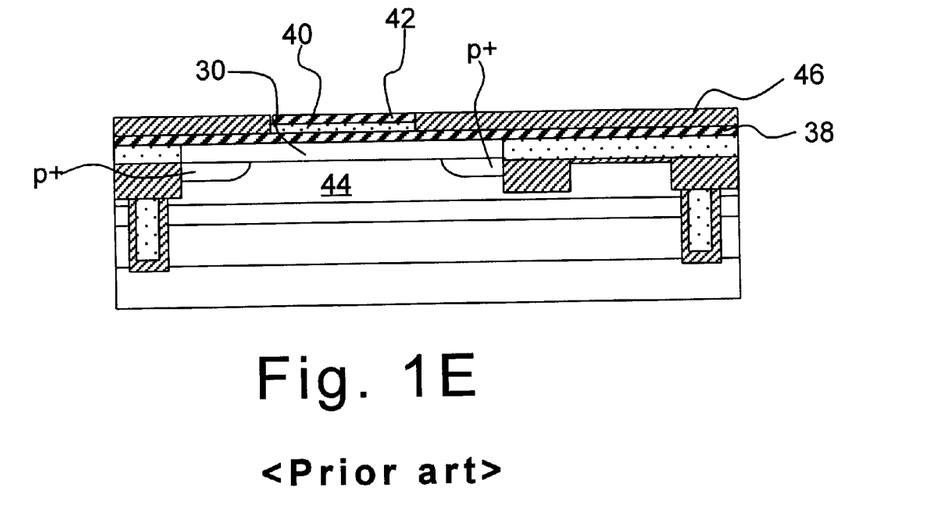
Figure 1F:
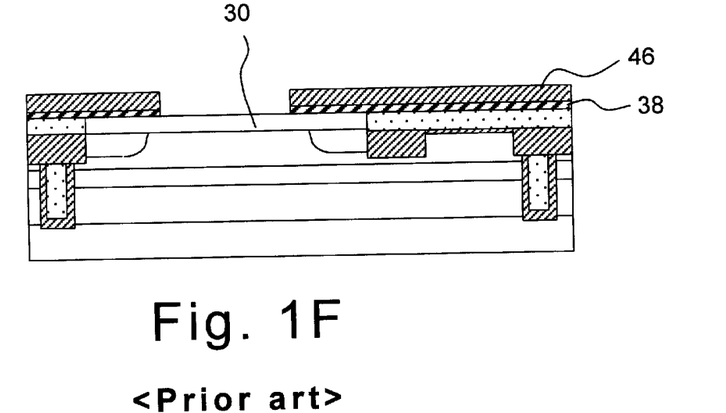

Then an implantation step is utilized to form the P$^+$ region, besides, an oxidation step is utilized to proceed with the wafer, so the portion of the second polysilicon layer 40 without coverage from the patterned second silicon nitride layer 42 are transformed to the third silicon dioxide layer 46 as shown in FIG. 1E. In addition, the P$^+$ region is driven deeper into the n$^-$ epitaxial layer 14. Subsequently, as shown in FIG. 1E, the patterned second silicon dioxide layer 44 is removed and the patterned second silicon nitride layer 42 is exposed. This is followed by etching the patterned second silicon nitride layer 42, a portion of the first silicon nitride layer 38 is covered by the remaining second polysilicon layer 40 and the remaining second polysilicon layer 40 are removed, as shown in FIG. 1F, and a portion of the GeSi epitaxial layer 30 is exposed.

Figure 1G:
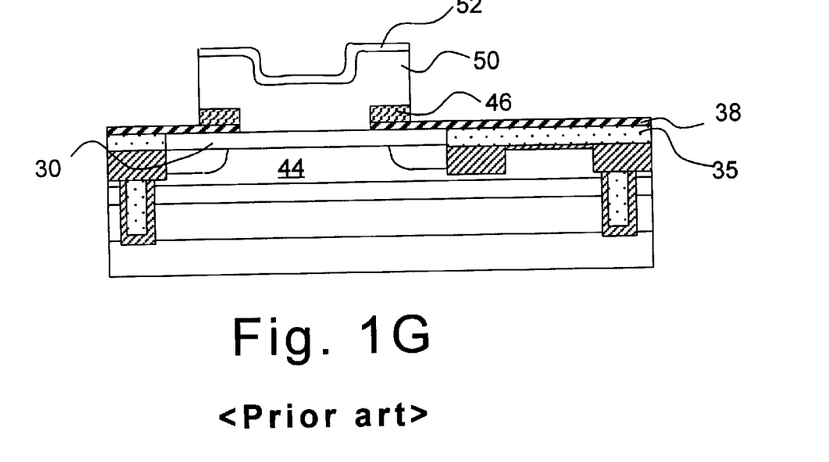

These steps are followed by subsequently forming a n$^+$ polysilicon layer 50 and a third silicon nitride layer 52 on the exposed portion of GeSi epitaxial layer 30, a photolithography step and an etching step are employed to define the n$^+$ polysilicon layer 50, the third silicon nitride layer 52, and the third silicon dioxide layer 46, thus forming the patterned n$^+$ polysilicon layer 50 and the patterned third silicon nitride layer 52 as shown in FIG. 1G. Besides, a portion of the third silicon dioxide layer 46 is covered by the patterned n⁺ polysilicon layer 50 still remains after the foregoing etching step. The patterned n⁺ polysilicon layer 50 comprises the emitter of the SiGe bipolar transistor.

Figure 1H:
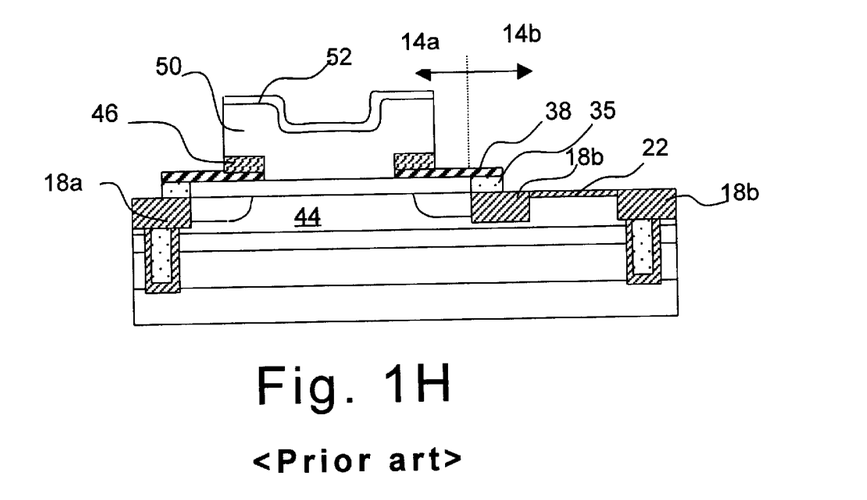

Next, a photolithography step and an etching step are employed to etch a portion of the first silicon nitride layer 38, the polycrystalline GeSi layer 35 to the native oxide layer 22, a portion of the second silicon dioxide pattern 18b, and a portion of the first silicon dioxide pattern 18a are exposed as shown in FIG. 1H. The patterned silicon nitride layer 38 and the patterned polycrystalline GeSi layer 35 are electrically coupled to the base of the SiGe bipolar transistor. Besides, the n⁻ epitaxial layer 14 in the second area 14b is electrically coupled to the collector of the SiGe bipolar transistor.

According to the prior art, the n⁻ epitaxial layer 14 and the GeSi epitaxial layer 30 are not formed in situ, so the quality of the base of the SiGe bipolar transistor is easily out of control. In order to remove the native oxide layer resulting from the activity mentioned above, the operator is obliged to use HF to clean the wafer before forming the base of the SiGe bipolar transistor. In addition, the cleaning step cannot thoroughly remove the native oxide layer before forming the GeSi epitaxial layer (base). So the prior art takes more time to preclean the wafer so as to remove the any impurity and native oxide at the surface and must carefully deposit the SiGe base layer in order to assure good quality, especially where the device is utilized in high frequency circuit.

SUMMARY OF THE INVENTION

A method for fabricating a bipolar transistor frequently used in a high frequency circuit is disclosed herein. The foregoing method employed to fabricate a SiGe bipolar transistor includes the following steps. First, a first oxide layer is formed on a P-type substrate. This step is followed by developing a first photoresist pattern on the first oxide layer, a first doped region is then formed in the exposed substrate by a first implanting step, wherein the first doped region comprises a n⁺ buried layer.

Then stripping the first photoresist pattern, and the annealing the n+ buried layer to enlarge its depth are then undertaken. Subsequently, the first oxide layer is removed to expose the n+ buried layer and a portion of the P-type substrate. This is followed by growing a first epitaxial layer on the n+ buried layer and the exposed portion of the substrate, a second epitaxial layer is formed on the first epitaxial layer. The first epitaxial layer is made of epitaxial n-type silicon, and the second epitaxial layer is made of epitaxial p-type SiGe in situ. Next, a plurality of first trenches are formed to expose a portion of the p-type substrate followed by filling a first insulating material in the plurality of first trenches to form a plurality of first trench isolation.

Similarly, a plurality of second trenches in the first epitaxial layer, the first epitaxial layer and the second epitaxial layer are etched to be divided into a first area and a second area. Besides, the first area and the second area are divided by one of the plurality of second trenches located between every two of the plurality of first trench isolation. Then a second insulating material is filled into the plurality of second trenches, thus a plurality of second trench isolations is formed. This step is followed by forming a gate oxide layer on the second epitaxial layer and the plurality of first trench isolations, a base photoresist pattern is developed on a first portion of the gate oxide layer, and a second portion of the gate oxide layer is exposed. Subsequently, a first extrinsic base region and a second extrinsic base region are formed in the second epitaxial layer by a second implanting step using the base photoresist pattern as a mask.

The first portion of the second epitaxial layer is provided without any additional implant process between the first extrinsic base region and the second extrinsic base region is in the first area, and the second portion of the second epitaxial layer remaining p-type SiGe layer is in the second area. After the base photoresist pattern is removed, an emitter window photoresist pattern is developed on the plurality of second trench isolation and on a first portion of the gate oxide layer. The second portion of the gate oxide layer covering the p-type SiGe layer first portion of the second epitaxial layer in the first area is exposed after developing the emitter window photoresist pattern. Next, the second portion of the gate oxide layer is etched to expose the undoped first portion of the second epitaxial layer in the n⁻ epitaxy layer. This is followed by implanting a plurality of charges into the n+ buried layer to form a n-type selective implant collector, and the emitter window photoresist pattern is removed.

A first polysilicon layer is then formed on the exposed first portion of the second epitaxial layer in the first area, a portion of the second portion of the gate oxide layer, and the plurality of second trench isolation. After the first polysilicon layer is patterned to form an emitter pattern coupling to the exposed first portion of the second epitaxial layer in the n+ buried layer, a collector photoresist pattern is developed on the emitter pattern, the plurality of second trench isolation, and the second portion of the gate oxide layer. The first portion of the gate oxide layer covering the p-type SiGe layer second portion of the second epitaxial layer in the second area is exposed after developing the collector photoresist pattern. Then the collector photoresist pattern is used as a mask to etch an exposed portion of the first portion of the gate oxide layer and the underlying p-type SiGe layer of the second portion of the second epitaxial layer in the second area to expose a portion of the first doped region.

Next, a metal silicide layer is formed on the exposed portion of the first doped region. Subsequently, the collector photoresist pattern is removed. The metal silicide layer acts as the collector of the bipolar transistor, and the emitter pattern act as the emitter of the bipolar transistor. In addition, the first extrinsic base region, the second extrinsic base region, and the p-type SiGe layer of the first portion of the second epitaxial layer in the first area comprises the base of the bipolar transistor. To fabricate a complete layout of the bipolar transistor, a dielectric layer is formed on the metal silicide layer, the emitter pattern, the plurality of second trench isolations, and the second portion of the gate oxide layer. In addition, the dielectric layer and a portion of the second portion of the gate oxide layer covering the first extrinsic base region are etched to expose a portion of the first extrinsic base region, the emitter pattern and the metal silicide layer.

Besides, a metal layer is formed on the dielectric layer, a portion of the first extrinsic base region, the emitter pattern and the metal silicide layer. Finally, the metal layer is etched to form a base electrode connected to the exposed portion of the first extrinsic base region, an emitter electrode connected to the emitter pattern, and a collector electrode connected to the metal silicide layer. Typically, the p-type substrate mentioned above has sheet resistance about 15–25 Ohms-cm.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

Because the prior art separately formed the $n^-$ epitaxial layer and the GeSi epitaxial layer, the quality of the base of the SiGe bipolar transistor is not good. However, the quality of the base of the bipolar transistor is very important to the characteristic of the transistor especially when utilized in a high frequency circuit. Accordingly, the present invention is designed to improve the quality of the base of the bipolar transistor. In addition, the present invention improves the characteristic of the bipolar transistor such that it has a higher three-decibel-frequency (three db frequency) and a higher maximum frequency than that of the prior art due to the lowered thermal budget resulting from the shallow trench and deep trench isolation. So the present invention can fabricate the bipolar transistor having good quality, especially for the transistor utilized in high frequency circuit.

Figure 2A:
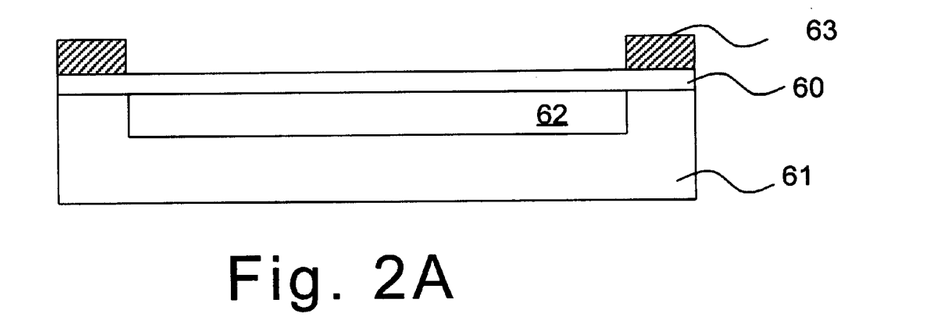
FIGS. 2A to 2H illustrate the processes utilized to fabricate the basic structure of the SiGe bipolar transistor using two layer of epitaxial layer according to the present invention.

The process sequence employed to manufacture the heterojunction bipolar transistor (HBT) is described to illustrate how a SiGe bipolar transistor is fabricated by the method according to the preferred embodiment in the present invention. As shown in FIG. 2A, the first step is to form a first oxide layer 60 on a P type substrate 61, and the next step is to form a $n_+$ buried layer 62 in the P type substrate 61. The thickness of first oxide layer 60 is about 140 angstroms and the sheet resistance of the P type substrate 61 is about 15–25 Ohms-cm. In addition, the first photo-mask (not shown) is employed in the first photolithography step to develop the first photoresist layer 63 on a covered-portion of the P type substrate 61. Followed by a first implanting step applied to the exposed-portion of the P type substrate 61, the $n^+$ buried layer 62 is formed in the exposed portion of the P type substrate 61. In the preferred embodiment of the present invention, $Sb^+$ is utilized in the first implanting step as the dopant source, besides, the implant energy is about 50–100 Kev (70 Kev is preferred), and the dopant concentration is about 1E15 to 5E16 (5E15 is preferred). Alternatively, $As^+$ can be used in the first implanting step as the dopant source, the implant energy is about 50–100 Kev (70 Kev is preferred), and the dopant concentration is about 1E15 to 5E16 (5E15 is preferred). After the first implanting step had been applied to the exposed-portion of the P type substrate 61, when $Sb^+$ is used as the dopant source, the following annealing process is occurred at about 1100 –1200° for about 60–120 minutes. However, when $As^+$ is utilized, the following annealing process is occurred at about 1000 –1150° for about 60–120 minutes. After the foregoing annealing step, referring to FIG. 2B, the dopant atom is driven deeper into the P type substrate 61, and the depth of the $n^+$ buried layer 62 is more than about 1 micron.

Figure 2B:
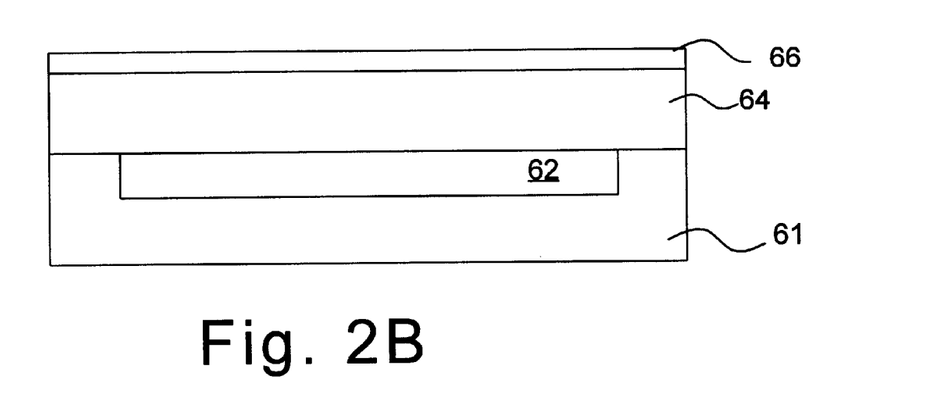

Subsequently, having removed the first oxide layer 60, followed by a RCA cleaning process, an epitaxial layer 64 is formed on the $n^+$ buried layer 62 and a portion of the P type substrate 61. The n epitaxial layer 64 is of the thickness about 0.5–1 micron (1 micron is preferred), and is of the sheet resistance about 0.5 Ohms-cm. The RCA cleaning process is performed by diluted HF, which is composed of HF and water at the ratio of 10, and the n epitaxial layer 64 formed in the following process is designed to be the collector of the transistor. Next, P type SiGe layer 66 is formed on the n epitaxial layer 64 in situ, besides, the P type SiGe layer 66 includes Ge about 0–40%, and the concentration of the dopant (such as Boron) is of the range about 1E18 to 1E20 $cm^{-3}$. Because the P type SiGe layer 66 is formed in situ, no native oxide exist between the n epitaxial layer 64 and the P type SiGe layer 66.

Figure 2C:
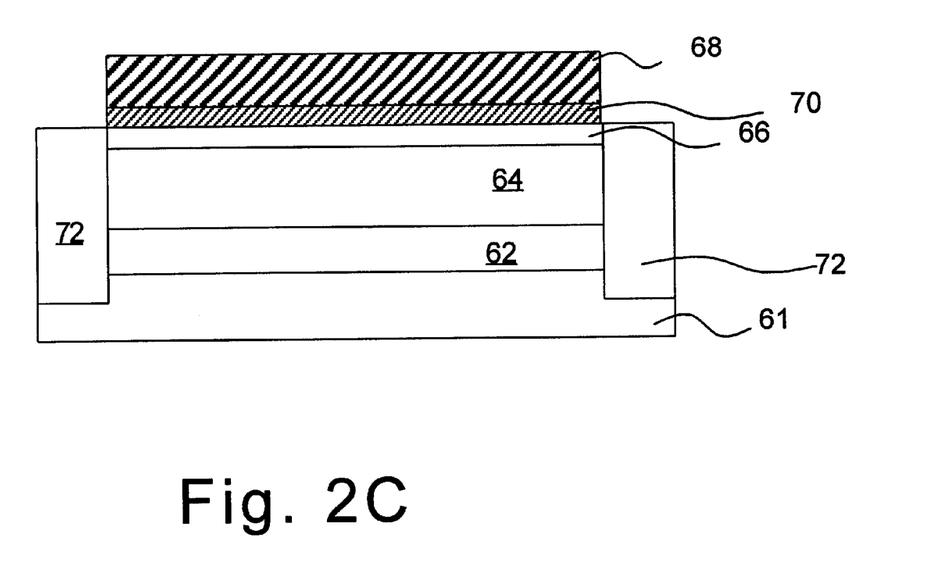

Referring to FIG. 2C, a first-trench photo-mask is employed in the first trench photolithography process to develop a first trench defining photoresist layer 68 on the native oxide layer 70 naturally generated on the P type SiGe layer 66. During a first trench etching step, the exposed portion of the native oxide layer 70 and its underlying layers, such as a portion of the P type SiGe layer 66, a portion of the n epitaxial layer 64, a portion of the $n^+$ buried layer 62 and a portion of the P type substrate 61, are etched to form the first trenches. This step is followed by filling oxide into the first trenches, the first trench isolation 72 is formed in the first trenches.

Figure 2D:
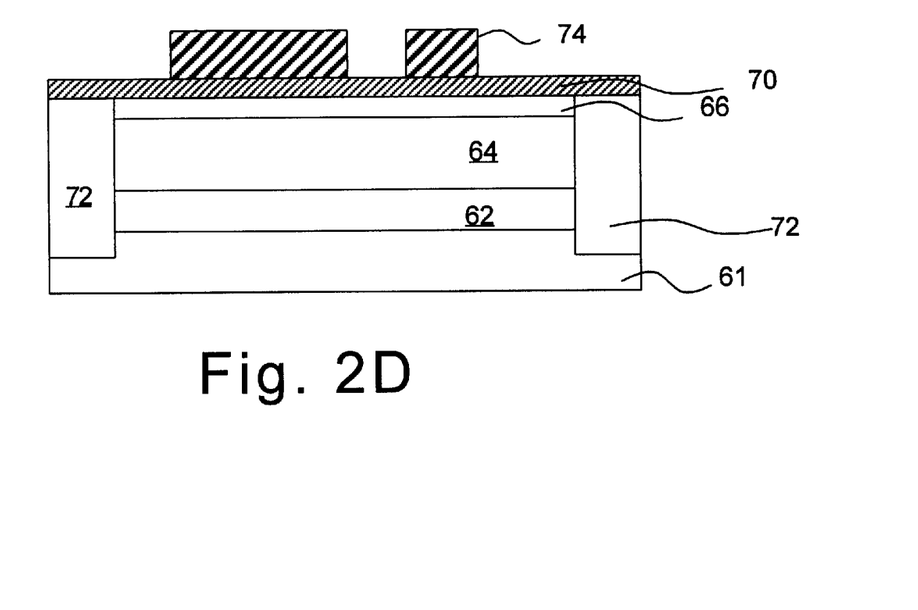
Figure 2E:
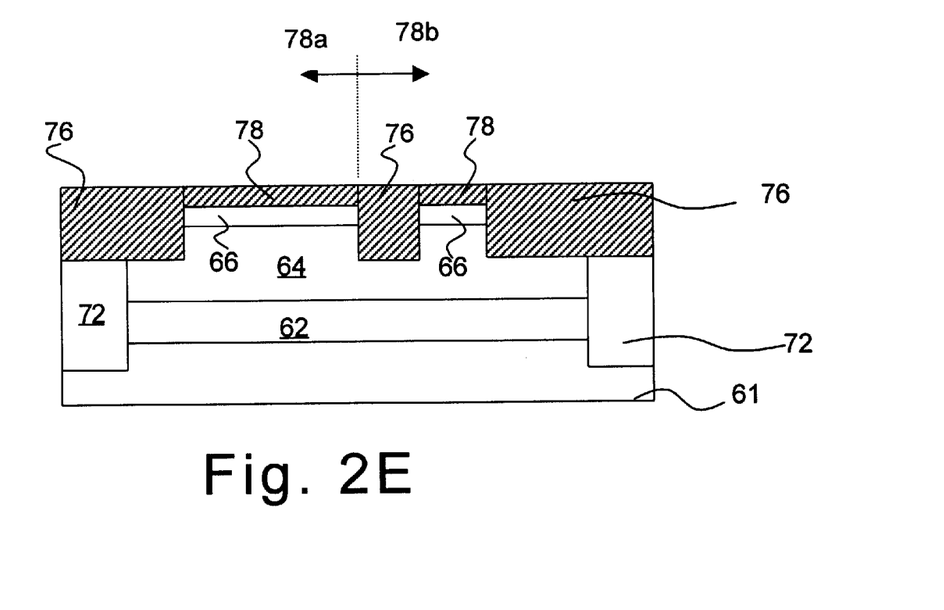

Referring to FIG. 2D, a second-trench photo-mask is employed in the second trench photolithography process to develop a second trench defining photoresist layer 74 on the regenerated native oxide layer 70 on the etched P type SiGe layer 66. Turning to FIG. 2E, during the time the second trench etching step has been applied to the wafer, the exposed portion of the regenerated native oxide layer 70 and its underlying layers (such as a portion of the P type SiGe layer 66, and a portion of the n epitaxial layer 64) are removed to form the second trench. Then the oxide is filled into the second trenches to form a plurality of second trench isolations 76. After the plurality of second trench isolations 76 has been defined, a thermal process is used to transform the native oxide layer 70 to the gate oxide layer 78 under 550–700° C. (600° C. is preferred), and the thickness of the gate oxide layer 78 can be 100 angstroms. In one preferred embodiment of the present invention, one of the second trenches exposing one of the plurality of first trench isolations 72 is in the first area 78a, which will be defined as the active area of the transistor. In addition, the other of the second trenches exposing the other of the plurality of first trench isolations 72 is in the second area 78b, which is to be defined as the collector of the transistor. Besides, another of the plurality of second trench isolations 76 isolate a first portion of the n epitaxial layer 64 in the first area 78a form the second portion of the n epitaxial layer 64 in the second area 78b.

Figure 2F:
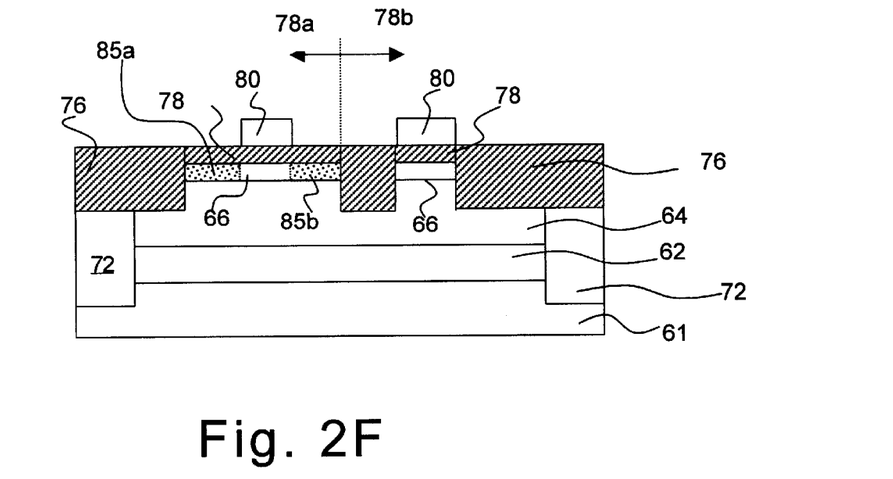

Referring to FIG. 2F, an extrinsic base photo-mask is employed in an extrinsic base photolithography process to develop the extrinsic base photoresist layer 80. A first portion of the extrinsic base photoresist layer 80 is formed in the first area 78a of the gate oxide layer 78. A second portion of the extrinsic base photoresist layer 80 is formed in the second area 78b of the gate oxide layer 78b, and the portion of the n epitaxial layer 64 in the second area 78b between the plurality of second trench isolation 76 is covered by the extrinsic base photoresist layer 80 in the second area 76b. Then a first extrinsic base region 85a and a second extrinsic base region 85b are formed by an implanting step using the first portion of the extrinsic base photoresist layer 80 as a mask. In addition, the second extrinsic base region 85b is also formed adjacent to the other of the plurality of second trench isolation 76 in the second area 78b, and a portion of the P type SiGe layer 66. The concentration of the dopant utilized in the foregoing implanting step is about 1E15 to 5E16 (5E15 is preferred). As shown in FIG. 2F, the intrinsic base portion of the P type SiGe layer 66 is between the first extrinsic base region 85a and a second extrinsic base region 85b.

Figure 2G:
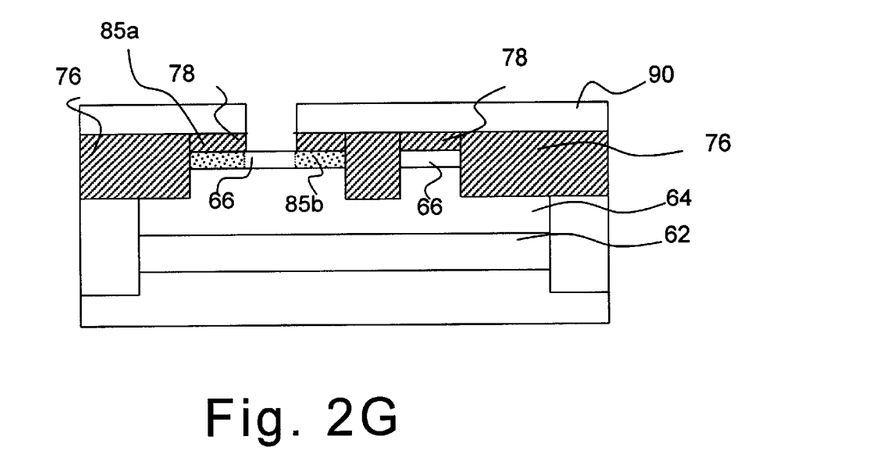

Next, followed by forming a polysilicon layer (not shown) of about 500 angstroms in thickness, turning to FIG. 2G, the next step is to develop an emitter window photoresist layer 90 exposing a portion of the gate oxide layer 78 underlying the intrinsic portion of the P type SiGe layer 66. Then the emitter window photoresist layer 90 is used as the mask to etch the exposed portion of the gate oxide layer 78 till the undoped portion of the P type SiGe layer 66 is exposed. Then perform a selective implant collector (SIC) implant step is performed to form a doped region (not shown) in the n epitaxial layer 64 under the undoped portion of the P type SiGe layer 66. The concentration of the dopant utilized in the foregoing SIC implant step is about 1E12 to 1E14 cm$^{-2}$, and the implanting energy is about 180–450 KeV.

Figure 2H:
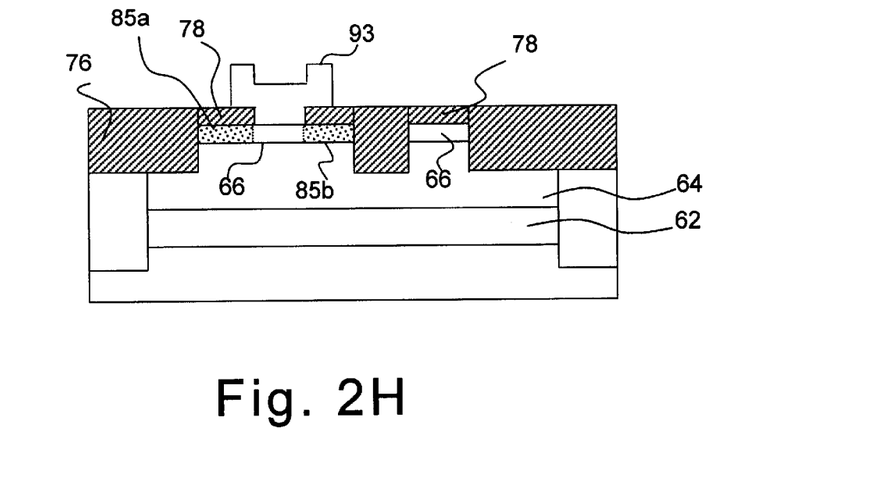
Figure 2I:
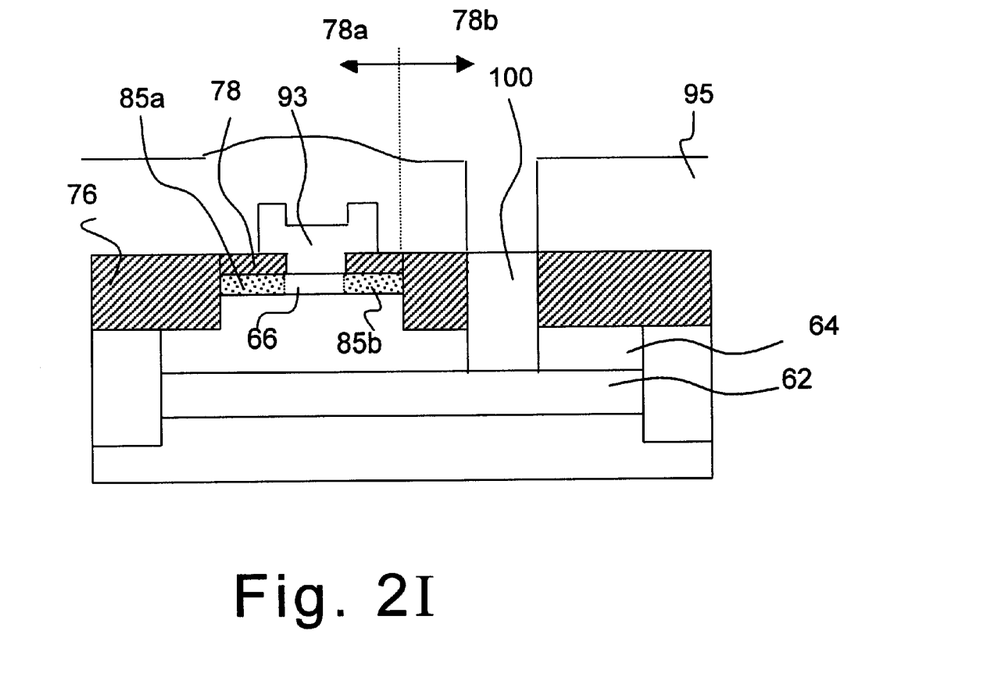
FIGS. 2I to 2K illustrate the processes utilized to fabricate the complete layout of the SiGe bipolar transistor according to one preferred embodiment of the present invention.

After the foregoing SIC implant step is introduced to form the doped region in the n epitaxial layer 64, the emitter window photoresist layer 90 is removed and then a polysilicon layer (not shown) having thickness about 3000 angstroms is formed on the gate oxide layer 78 and the exposed intrinsic portion of the P type SiGe layer 66. This step is followed by developing an emitter photoresist layer (not shown) on the polysilicon layer, an emitter etching step is utilized to etch the exposed polysilicon layer and to form the emitter 93 as shown in FIG. 2H, then the emitter photoresist layer is removed. Next, a collector photoresist pattern 95 is developed on the emitter 93 as well as the gate oxide layer 78, however, the gate oxide layer 78 in the second area 78b is exposed. This is followed by a deep collector etching step, the exposed gate oxide layer 78, and its underlying P type SiGe layer 66 as well as its n epitaxial layer 64 in the second area 78b is etched till the n$^+$ buried layer 62 is exposed as shown in FIG. 2I. Subsequently, a tungsten silicide layer 100 is selectively formed on the exposed n$^+$ buried layer 62 and the collector photoresist pattern 95 is removed.

Figure 2J:
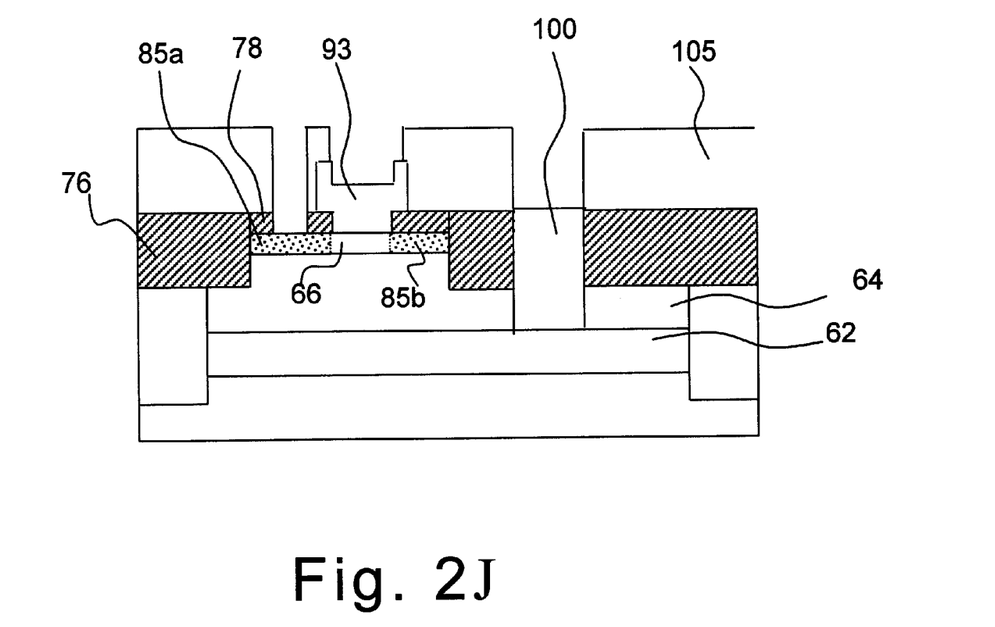
Figure 2K:
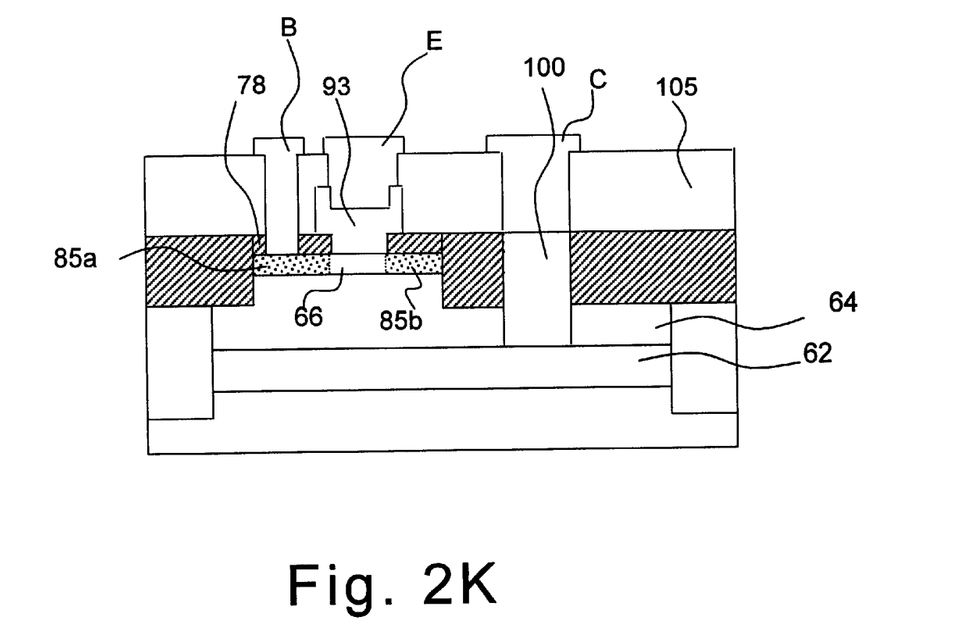

The following step is to use a low temperature oxidation step to form a borophosphosilicate glass (BPSG) layer 105 on the wafer. Followed by an annealing step, a photolithography step and an etching step are introduced into the wafer process, so the BPSG layer 105 and the gate oxide layer 78 are etched. And then portion of the underlying first extrinsic base region 85a, a portion of the emitter 93, and the tungsten silicide layer 100 are exposed as shown in FIG. 2J. Next, a metal layer is deposited on the wafer, and then a photolithography step and an etching step are used to define the metal pattern. The metal layer is etched to form the emitter electrode E connecting to the emitter 93, the base electrode B connecting to the first extrinsic base region 85a, and the collector electrode C connecting to the tungsten silicide layer 100. Thus referring to FIG. 2K, the SiGe bipolar transistor is fabricated thereby, and there is not any native oxide layer which exists between the n epitaxial layer 64 and the P type SiGe layer 66 (including the first extrinsic base region 85a and the second extrinsic base region 85b).

Figure 2L:
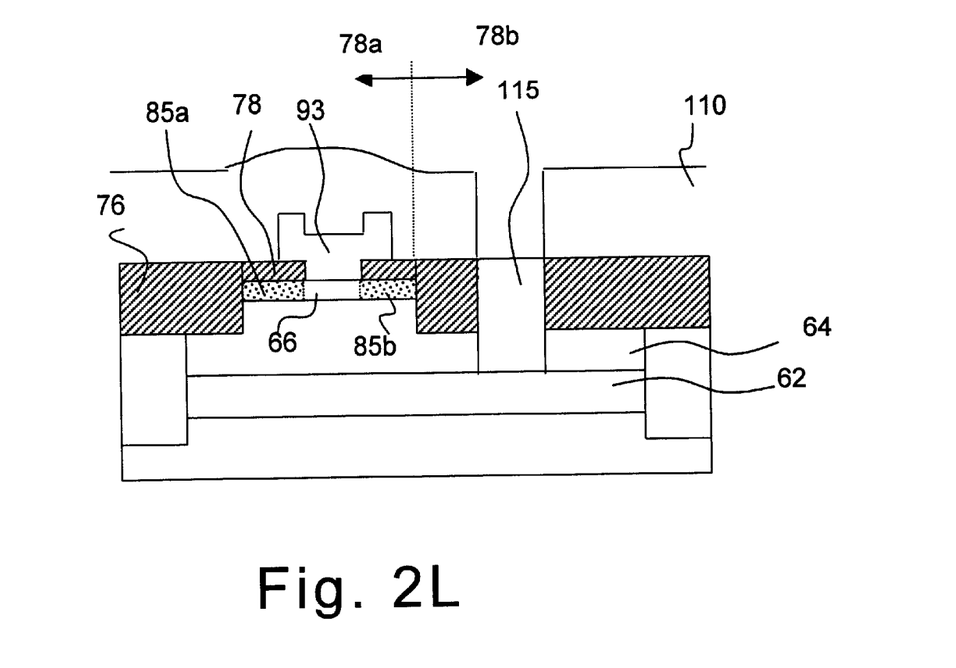
FIGS. 2L to 2N illustrate the processes utilized to fabricate the complete layout of the SiGe bipolar transistor according to the other preferred embodiment of the present invention.
Figure 2M:
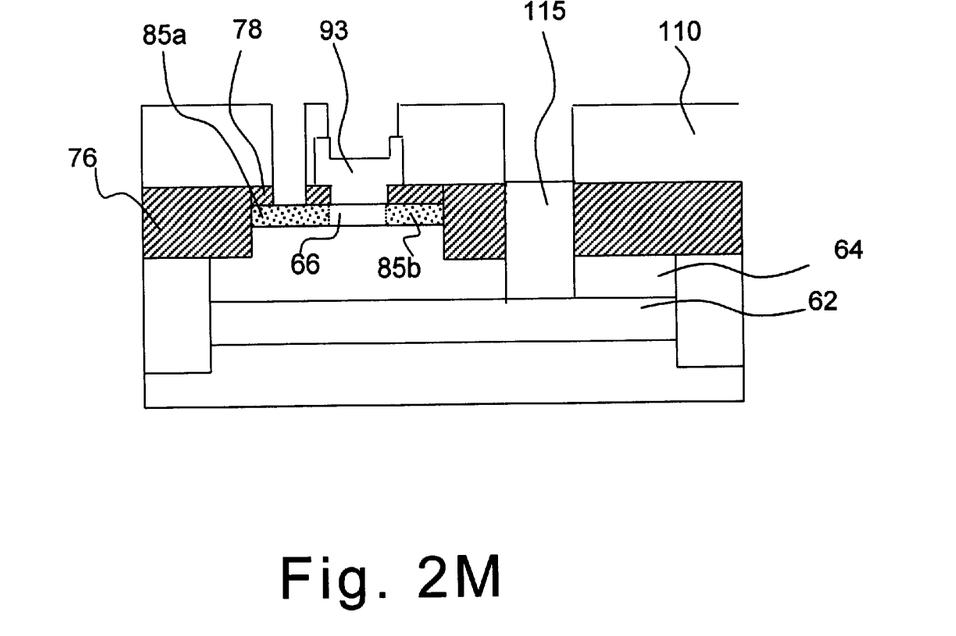
Figure 2N:
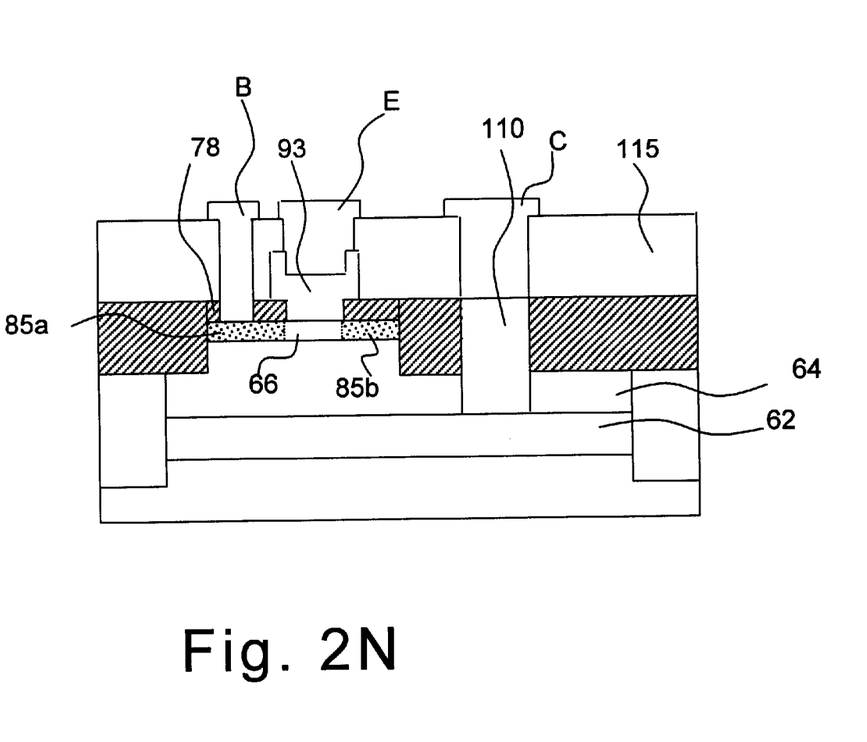

In the other preferred embodiment of the present invention, the processes are similar to that disclosed by the foregoing embodiment as shown in FIG. 2A–2H. In addition, according to the other preferred embodiment of the present invention, next referring to FIG. 2L, a TEOS/BPSG layer 110 is formed on the wafer. Then a collector mask (not shown) is used, and an etching step is used to etch a portion of the TEOS/BPSG layer 110, its underlying gate oxide layer 78 in the second area 78b, and the portion of the n epitaxial layer 64 in the second area 78b. Thus a portion of the n$^+$ buried layer 62 is exposed. Next, a tungsten silicide layer 115 is selectively formed on the exposed portion of the n$^+$ buried layer 62. Subsequently, an annealing step is applied to the wafer. Then a photolithography step and an etching step are applied to the wafer, so the TEOS/BPSG layer 110 and the gate oxide layer 78 are etched. Thus a portion of the underlying first extrinsic base region 85a, a portion of the emitter 93, and the tungsten silicide layer 115 are exposed as shown in FIG. 2M. Next, a metal layer is formed on the wafer. And then a photolithography step and an etching step, the metal layer is etched to form the emitter electrode E connecting to the emitter 93, the base electrode B connecting to the first extrinsic base region 85a, and the collector electrode C connecting to the tungsten silicide layer 115. Thus referring to FIG. 2N, the SiGe bipolar transistor is fabricated thereby, and there is not any native oxide layer exist between the n epitaxial layer 64 and the P type SiGe layer 66 (including the first extrinsic base region 85a and the second extrinsic base region 85b).

Although specific embodiments have been illustrated and described it will be obvious to those skilled in the art that various modification may be made without departing from the spirit, of the present invention which is intended to be limited solely by the appended claims. For example, the recipe utilized by the foregoing photolithography steps and etching step, in addition, the method utilized by the foregoing implantation steps can be varied without departing from the present invention.

What is claimed is:

1. A Method for fabricating bipolar transistor, said method comprising the steps of:

forming a first oxide layer on a substrate having a first conductivity;

developing a first photoresist pattern on said first oxide layer;

forming a first doped region in said substrate without coverage from said first photoresist pattern by a first implanting step, said first doped region compose a buried layer having a second conductivity;

striping said first photoresist pattern;

annealing said first doped region to enlarge depth of said first doped region;

removing said first oxide layer to expose said first doped region and a portion of said substrate;

growing a first epitaxial layer on said first doped region and said exposed portion of said substrate, said first epitaxial layer being made of epitaxial silicon having said second conductivity;

growing a second epitaxial layer on said first epitaxial layer, said second epitaxial layer being made of epitaxial SiGe having said first conductivity, said second epitaxial layer being formed insitu with said first epitaxial layer;

forming a plurality of first trenches to expose a portion of said substrate;

filling a first insulating material in said plurality of first trenches to form a plurality of first trench isolation;

forming a plurality of second trenches in said first epitaxial layer, said first epitaxial layer and said second epitaxial layer being etched to be divided into a first area and a second area, said first area and said second area being divided by one of said plurality of second trenches locating between every two of said plurality of first trench isolation;

filling a second insulating material in said plurality of second trenches to form a plurality of second trench isolation;

forming a gate oxide layer on said second epitaxial layer and said plurality of first trench isolation;

developing a base photoresist pattern on a first portion of said gate oxide layer to expose a second portion of said gate oxide layer;

forming a first extrinsic base region and a second extrinsic base region in said second epitaxial layer by a second implanting step using said base photoresist pattern as a mask, a first portion of said second epitaxial layer remaining undoped between said first extrinsic base region and said second extrinsic base region being in said first area, a second portion of said second epitaxial layer remaining undoped being in said second area;

removing said base photoresist pattern;

developing an emitter window photoresist pattern on said plurality of second trench isolation and on a first portion of said gate oxide layer, a second portion of said gate oxide layer covering said undoped first portion of said second epitaxial layer in said first area being exposed after developing said emitter window photoresist pattern;

etching said second portion of said gate oxide layer to expose said undoped first portion of said second epitaxial layer in said first area;

implanting a plurality of charges into said first doped region to form a selective implant collector having said second conductivity;

removing said emitter window photoresist pattern;

forming a first polysilicon layer on said exposed first portion of said second epitaxial layer in said first area, on a portion of said second portion of said gate oxide layer, and on said plurality of second trench isolation;

patterning said first polysilicon layer to form an emitter pattern coupling to said exposed first portion of said second epitaxial layer in said first area;

developing a collector photoresist pattern on said emitter pattern, on said plurality of second trench isolation, and on said second portion of said gate oxide layer, said first portion of said gate oxide layer covering said undoped second portion of said second epitaxial layer in said second area being exposed after developing said collector photoresist pattern;

using said collector photoresist pattern as a mask to etch an exposed portion of said first portion of said gate oxide layer and underlying said undoped second portion of said second epitaxial layer in said second area to expose a portion of said first doped region;

forming a metal silicide layer on said exposed portion of said first doped region; and removing said collector photoresist pattern, said metal silicide layer being collector of said bipolar transistor, said emitter pattern being emitter of said bipolar transistor, said first extrinsic base region, said second extrinsic base region, and said undoped first portion of said second epitaxial layer in said first area composing base of said bipolar transistor.

2. The method as claim 1 further comprising the steps of:

forming a dielectric layer on said metal silicide layer, said emitter pattern, said plurality of second trench isolation, and said second portion of said gate oxide layer, etching said dielectric layer and a portion of said second portion of said gate oxide layer covering said first extrinsic base region to expose a portion of said first extrinsic base region, said emitter pattern and said metal silicide layer;

forming a metal layer on said dielectric layer, a portion of said first extrinsic base region, said emitter pattern and said metal silicide layer; and etching said metal layer to form a base electrode connecting to said exposed portion of said first extrinsic base region, an emitter electrode connecting to said emitter pattern, and a collector electrode connecting to said metal silicide layer.

3. The method as claim 1, wherein said substrate has sheet resistance about 15–25 Ohms-cm.

4. The method as claim 1, wherein said first implanting step is applied to said first doped region by using Sb as source of dopant, implanting energy of said first implanting step is about 50 to 100 Kev, concentration of said dopant is about 1E15 to 1E16.

5. The method as claim 4, wherein said first doped region is disposed in 1100–1200° C. for about 60–120 minutes.

6. The method as claim 1, wherein said first implanting step is applied to said first doped region by using As as source of dopant, implanting energy of said first implanting step is about 50 to 100 Kev, concentration of said dopant is about 1E15 to 1E16.

7. The method as claim 6, wherein said first doped region is disposed in 1000° C. to 1150° C. for about 60–120 minutes.

8. The method as claim 1, wherein said first doped region is annealed to enlarge depth of said first doped region to a depth more than 1 micron.

9. The method as claim 1, wherein said first doped region is immersed into diluted HF solution before forming said first epitaxial layer.

10. The method as claim 1, wherein said first epitaxial layer is about 0.5 to 1 micron in thickness, sheet resistance of said first epitaxial layer is about 0.5 Ohms-cm.

11. The method as claim 1, wherein said second epitaxial layer is made of P type epitaxial SiGe, Ge composition is about 0–40%, boron is utilized as dopant, concentration of said dopant is about 1E18 to 1E20 $cm^{-3}$.

12. The method as claim 1, wherein said plurality of first trenches are formed by the steps comprising:

developing a first trench photoresist pattern on a native oxide layer to expose a portion of said native oxide layer, said native oxide layer being formed on said second epitaxial layer by ambient temperature;

etching said exposed portion of said native oxide layer to form said plurality of first trenches, said plurality of first trenches exposing said substrate; and removing said first trench photoresist pattern.

13. The method as claim 1, wherein said plurality of second trenches are formed by the steps comprising:

developing a second trench photoresist pattern on a native oxide layer to expose a portion of said native oxide layer, said native oxide layer being formed on said second epitaxial layer by ambient temperature;

etching said exposed portion of said native oxide layer to form said plurality of second trenches, said plurality of second trenches exposing said first epitaxial layer; and removing said second trench photoresist pattern.

14. The method as claim 1, wherein said gate oxide layer is formed at the temperature from about 550–700° C., said gate oxide layer is about 100 angstroms in thickness.

15. The method as claim 1, wherein said second implanting step uses boron as dopant having concentration about 1E15 to 1E16.

16. The method as claim 1, wherein said selective implant collector is formed using phosphorus as dopant having concentration from about 1E12 to 1E14 $cm^{-2}$.

17. The method as claim 1, wherein said selective implant collector is formed using phosphorus as dopant having implant energy from 180 to 450 KeV.

18. A Method for fabricating bipolar transistor, said method comprising the steps of:

forming a first oxide layer on a substrate having a first conductivity;

developing a first photoresist pattern on said first oxide layer;

forming a first doped region in said substrate without coverage from said first photoresist pattern by a first implanting step, said first doped region compose a buried layer having a second conductivity;

striping said first photoresist pattern;

annealing said first doped region to enlarge depth of said first doped region;

removing said first oxide layer to expose said first doped region and a portion of said substrate;

growing a first epitaxial layer on said first doped region and said exposed portion of said substrate, said first epitaxial layer being made of epitaxial silicon having said second conductivity;

growing a second epitaxial layer on said first epitaxial layer, said second epitaxial layer being made of epitaxial SiGe having said first conductivity, said second epitaxial layer being formed insitu with said first epitaxial layer;

forming a plurality of first trenches to expose a portion of said substrate;

filling a first insulating material in said plurality of first trenches to form a plurality of first trench isolation;

forming a plurality of second trenches in said first epitaxial layer, said first epitaxial layer and said second epitaxial layer being etched to be divided into a first area and a second area, said first area and said second area being divided by one of said plurality of second trenches locating between every two of said plurality of first trench isolation;

filling a second insulating material in said plurality of second trenches to form a plurality of second trench isolation;

forming a gate oxide layer on said second epitaxial layer and said plurality of first trench isolation;

developing a base photoresist pattern on a first portion of said gate oxide layer to expose a second portion of said gate oxide layer;

forming a first extrinsic base region and a second extrinsic base region in said second epitaxial layer by a second implanting step using said base photoresist pattern as a mask, a first portion of said second epitaxial layer remaining undoped between said first extrinsic base region and said second extrinsic base region being in said first area, a second portion of said second epitaxial layer remaining undoped being in said second area;

removing said base photoresist pattern;

developing an emitter window photoresist pattern on said plurality of second trench isolation and on a first portion of said gate oxide layer, a second portion of said gate oxide layer covering said undoped first portion of said second epitaxial layer in said first area being exposed after developing said emitter window photoresist pattern;

etching said second portion of said gate oxide layer to expose said undoped first portion of said second epitaxial layer in said first area;

implanting a plurality of charges into said first doped region to form a selective implant collector having said second conductivity;

removing said emitter window photoresist pattern;

forming a first polysilicon layer on said exposed first portion of said second epitaxial layer in said first area, on a portion of said second portion of said gate oxide layer, and on said plurality of second trench isolation;

patterning said first polysilicon layer to form an emitter pattern coupling to said exposed first portion of said second epitaxial layer in said first area;

developing a collector photoresist pattern on said emitter pattern, on said plurality of second trench isolation, and on said second portion of said gate oxide layer, said first portion of said gate oxide layer covering said undoped second portion of said second epitaxial layer in said second area being exposed after developing said collector photoresist pattern;

using said collector photoresist pattern as a mask to etch an exposed portion of said first portion of said gate oxide layer and underlying said undoped second portion of said second epitaxial layer in said second area to expose a portion of said first doped region;

forming a metal silicide layer on said exposed portion of said first doped region;

removing said collector photoresist pattern, said metal silicide layer being collector of said bipolar transistor, said emitter pattern being emitter of said bipolar transistor, said first extrinsic base region, said second extrinsic base region, and said undoped first portion of said second epitaxial layer in said first area composing base of said bipolar transistor;

forming a dielectric layer on said metal silicide layer, said emitter pattern, said plurality of second trench isolation, and said second portion of said gate oxide layer, etching said dielectric layer and a portion of said second portion of said gate oxide layer covering said first extrinsic base region to expose a portion of said first extrinsic base region, said emitter pattern and said metal suicide layer;

forming a metal layer on said dielectric layer, a portion of said first extrinsic base region, said emitter pattern and said metal silicide layer; and etching said metal layer to form a base electrode connecting to said exposed portion of said first extrinsic base region, an emitter electrode connecting to said emitter pattern, and a collector electrode connecting to said metal silicide layer.

19. The method as claim 18, wherein said substrate has sheet resistance about 15–25 Ohms-cm.

20. The method as claim 18, wherein said first implanting step is applied to said first doped region by using Sb as source of dopant, implanting energy of said first implanting step is about 50 to 100 Kev, concentration of said dopant is about 1E15 to 1E16.

21. The method as claim 20, wherein said first doped region is disposed in 1100–1200° C. for about 60–120 minutes.

22. The method as claim 20, wherein said first implanting step is applied to said first doped region by using As as source of dopant, implanting energy of said first implanting step is about 50 to 100 Kev, concentration of said dopant is about 1E15 to 1E16.

23. The method as claim 20, wherein said first doped region is annealed to enlarge depth of said first doped region to a depth more than 1 micron.

24. The method as claim 23, wherein said first doped region is disposed in 1000° C. to 1150° C. for about 60–120 minutes.

25. The method as claim 20, wherein said first doped region is immersed into diluted HF solution before forming said first epitaxial layer.

26. The method as claim 20, wherein said first epitaxial layer is about 0.5 to 1 micron in thickness, sheet resistance of said first epitaxial layer is about 0.5 Ohms-cm.

27. The method as claim 20, wherein said second epitaxial layer is made of P type epitaxial SiGe, Ge composition is about 0–40%, boron is utilized as dopant, concentration of said dopant is about 1E18 to 1E20 $cm^{-3}$.

28. The method as claim 20, wherein said plurality of first trenches are formed by the steps comprising:

developing a first trench photoresist pattern on a native oxide layer to expose a portion of said native oxide layer, said native oxide layer being formed on said second epitaxial layer by ambient temperature;

etching said exposed portion of said native oxide layer to form said plurality of first trenches, said plurality of first trenches exposing said substrate; and removing said first trench photoresist pattern.

29. The method as claim 20, wherein said plurality of second trenches are formed by the steps comprising:

developing a second trench photoresist pattern on a native oxide layer to expose a portion of said native oxide layer, said native oxide layer being formed on said second epitaxial layer by ambient temperature;

etching said exposed portion of said native oxide layer to form said plurality of second trenches, said plurality of second trenches exposing said first epitaxial layer; and removing said second trench photoresist pattern.

30. The method as claim 20, wherein said gate oxide layer is formed at the temperature from about 550–700° C., said gate oxide layer is about 100 angstroms in thickness.

31. The method as claim 20, wherein said second implanting step uses boron as dopant having concentration about 1E to 1E16.

32. The method as claim 20, wherein said selective implant collector is formed using phosphorus as dopant having concentration from about 1E12 to 1E14 $cm^{-2}$.

33. The method as claim 20, wherein said selective implant collector is formed using phosphorus as dopant having implant energy for 180 to 450 KeV.

* * * * *